United States Patent
Martens et al.

(10) Patent No.: US 10,481,178 B1
(45) Date of Patent: Nov. 19, 2019

(54) METHOD FOR MARKING DATA IN TIME/FREQUENCY MEASUREMENT

(71) Applicant: ANRITSU COMPANY, Morgan Hill, CA (US)

(72) Inventors: Jon Martens, San Jose, CA (US); David Judge, Cupertino, CA (US); Jamie Tu, San Jose, CA (US)

(73) Assignee: ANRITSU COMPANY, Morgan Hill, CA (US)

(*) Notice: Subject to any disclaimer, the term of this patent is extended or adjusted under 35 U.S.C. 154(b) by 724 days.

(21) Appl. No.: 14/521,336

(22) Filed: Oct. 22, 2014

Related U.S. Application Data

(60) Provisional application No. 61/894,185, filed on Oct. 22, 2013.

(51) Int. Cl.
- *G01R 13/02* (2006.01)
- *G01R 31/317* (2006.01)
- *G11B 27/30* (2006.01)
- *G11B 20/18* (2006.01)

(52) U.S. Cl.
CPC ... *G01R 13/0254* (2013.01); *G01R 31/31726* (2013.01); *G11B 20/18* (2013.01); *G11B 27/3027* (2013.01)

(58) Field of Classification Search
CPC .................................................. G01R 13/0254
See application file for complete search history.

(56) References Cited

U.S. PATENT DOCUMENTS

| | | |
|---|---|---|
| 5,801,525 A | 9/1998 | Oldfield |
| 5,812,039 A | 9/1998 | Oldfield |
| 5,909,192 A | 6/1999 | Finch |
| 5,977,779 A | 11/1999 | Bradley |
| 6,049,212 A | 4/2000 | Oldfield |
| 6,291,984 B1 | 9/2001 | Wong |
| 6,316,945 B1 | 11/2001 | Kapetanic |
| 6,331,769 B1 | 12/2001 | Wong |
| 6,496,353 B1 | 12/2002 | Chio |
| 6,504,449 B2 | 1/2003 | Constantine |
| 6,509,821 B2 | 1/2003 | Oldfield |
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |

(Continued)

*Primary Examiner* — Mohamed Charioui
*Assistant Examiner* — Christine Y Liao
(74) *Attorney, Agent, or Firm* — Tucker Ellis LLP

(57) ABSTRACT

A method for marking relevant data within an acquired set of data in accordance with an embodiment includes receiving a location of a first synchronization event within a synchronizing time pulse synchronized with the acquired set of data, searching the synchronizing time pulse within a predetermined window for the first synchronization event based on the location, identifying the first synchronization event based on the search, and obtaining data from the acquired set of data within an offset range determined based on the identified first synchronization event. The steps are then iteratively repeated for a number of periods.

13 Claims, 7 Drawing Sheets

(56) References Cited

U.S. PATENT DOCUMENTS

| | | | |
|---|---|---|---|
| 6,711,225 B1 * | 3/2004 | Sutardja | G11B 20/10009 370/509 |
| 6,714,898 B1 | 3/2004 | Kapetanic | |
| 6,766,262 B2 | 7/2004 | Martens | |
| 6,826,245 B1 * | 11/2004 | Brown | H04L 7/08 375/368 |
| 6,832,170 B2 | 12/2004 | Martens | |
| 6,839,030 B2 | 1/2005 | Noujeim | |
| 6,882,160 B2 | 4/2005 | Martens | |
| 6,888,342 B2 | 5/2005 | Bradley | |
| 6,894,581 B2 | 5/2005 | Noujeim | |
| 6,917,892 B2 | 7/2005 | Bradley | |
| 6,928,373 B2 | 8/2005 | Martens | |
| 6,943,563 B2 | 9/2005 | Martens | |
| 7,002,517 B2 | 2/2006 | Noujeim | |
| 7,011,529 B2 | 3/2006 | Oldfield | |
| 7,016,024 B2 | 3/2006 | Bridge | |
| 7,019,510 B1 | 3/2006 | Bradley | |
| 7,054,776 B2 | 5/2006 | Bradley | |
| 7,068,046 B2 | 6/2006 | Martens | |
| 7,088,111 B2 | 8/2006 | Noujeim | |
| 7,108,527 B2 | 9/2006 | Oldfield | |
| 7,126,347 B1 | 10/2006 | Bradley | |
| 7,284,141 B2 | 10/2007 | Stickle | |
| 7,304,469 B1 | 12/2007 | Bradley | |
| 7,307,493 B2 | 12/2007 | Feldman | |
| 7,509,107 B2 | 3/2009 | Bradley | |
| 7,511,496 B2 | 3/2009 | Schiano | |
| 7,511,577 B2 | 3/2009 | Bradley | |
| 7,521,939 B2 | 4/2009 | Bradley | |
| 7,545,151 B2 | 6/2009 | Martens | |
| 7,683,602 B2 | 3/2010 | Bradley | |
| 7,683,633 B2 | 3/2010 | Noujeim | |
| 7,705,582 B2 | 4/2010 | Noujeim | |
| 7,746,052 B2 | 6/2010 | Noujeim | |
| 7,764,141 B2 | 7/2010 | Noujeim | |
| 7,792,230 B1 * | 9/2010 | Gallagher | G06F 11/1687 375/354 |
| 7,795,230 B2 * | 9/2010 | Michelet | A61K 8/602 514/25 |
| 7,872,467 B2 | 1/2011 | Bradley | |
| 7,924,024 B2 | 4/2011 | Martens | |
| 7,957,462 B2 | 6/2011 | Aboujaoude | |
| 7,983,668 B2 | 7/2011 | Tiernan | |
| 8,027,390 B2 | 9/2011 | Noujeim | |
| 8,058,880 B2 | 11/2011 | Bradley | |
| 8,145,166 B2 | 3/2012 | Barber | |
| 8,156,167 B2 | 4/2012 | Bradley | |
| 8,159,208 B2 | 4/2012 | Brown | |
| 8,169,993 B2 | 5/2012 | Huang | |
| 8,185,078 B2 | 5/2012 | Martens | |
| 8,278,944 B1 | 10/2012 | Noujeim | |
| 8,294,469 B2 | 10/2012 | Bradley | |
| 8,305,115 B2 | 11/2012 | Bradley | |
| 8,306,134 B2 | 11/2012 | Martens | |
| 8,410,786 B1 | 4/2013 | Bradley | |
| 8,417,189 B2 | 4/2013 | Noujeim | |
| 8,457,187 B1 | 6/2013 | Aboujaoude | |
| 8,493,111 B1 | 7/2013 | Bradley | |
| 8,498,582 B1 | 7/2013 | Bradley | |
| 8,593,158 B1 | 11/2013 | Bradley | |
| 8,629,671 B1 | 1/2014 | Bradley | |
| 8,630,591 B1 | 1/2014 | Martens | |
| 8,666,322 B1 | 3/2014 | Bradley | |
| 8,718,586 B2 | 5/2014 | Martens | |
| 8,760,148 B1 | 6/2014 | Bradley | |
| 8,816,672 B1 | 8/2014 | Bradley | |
| 8,816,673 B1 | 8/2014 | Barber | |
| 8,884,664 B1 | 11/2014 | Bradley | |
| 8,903,149 B1 | 12/2014 | Noujeim | |
| 8,903,324 B1 | 12/2014 | Bradley | |
| 8,942,109 B2 | 1/2015 | Dorenbosch | |
| 9,103,856 B2 | 8/2015 | Brown | |
| 9,103,873 B1 | 8/2015 | Martens | |
| 9,176,174 B1 | 11/2015 | Bradley | |
| 9,176,180 B1 | 11/2015 | Bradley | |
| 9,210,598 B1 | 12/2015 | Bradley | |
| 9,239,371 B1 | 1/2016 | Bradley | |
| 9,287,604 B1 | 3/2016 | Noujeim | |
| 9,331,633 B1 | 5/2016 | Robertson | |
| 9,366,707 B1 | 6/2016 | Bradley | |
| 9,455,792 B1 | 9/2016 | Truesdale | |
| 9,560,537 B1 | 1/2017 | Lundquist | |
| 9,571,142 B2 | 2/2017 | Huang | |
| 9,588,212 B1 | 3/2017 | Bradley | |
| 9,594,370 B1 | 3/2017 | Bradley | |
| 9,606,212 B1 | 3/2017 | Martens | |
| 9,696,403 B1 | 7/2017 | Elder-Groebe | |
| 9,733,289 B1 | 8/2017 | Bradley | |
| 9,753,071 B1 | 9/2017 | Martens | |
| 9,768,892 B1 | 9/2017 | Bradley | |
| 9,860,054 B1 | 1/2018 | Bradley | |
| 9,964,585 B1 | 5/2018 | Bradley | |
| 9,967,085 B1 | 5/2018 | Bradley | |
| 9,977,068 B1 | 5/2018 | Bradley | |
| 10,003,453 B1 | 6/2018 | Bradley | |
| 10,006,952 B1 | 6/2018 | Bradley | |
| 10,064,317 B1 | 8/2018 | Bradley | |
| 10,116,432 B1 | 10/2018 | Bradley | |
| 2004/0076246 A1 * | 4/2004 | Vanderperren | H04L 27/2675 375/343 |
| 2006/0250135 A1 | 11/2006 | Buchwald | |
| 2011/0037667 A1 | 2/2011 | Varjonen | |
| 2011/0050995 A1 * | 3/2011 | Ozawa | H04H 20/18 348/468 |
| 2016/0050032 A1 | 2/2016 | Emerson | |

\* cited by examiner

T0      00000000010000000000000000000000000000000000010000000000000000...
B2      0000000000000000xxxxxxx00000000000000000000000000000000xxxxxxx0000...
                        delay                                           delay

METHOD FOR MARKING DATA IN TIME/FREQUENCY MEASUREMENT

TECHNICAL FIELD

The present invention relates to marking data for selective processing.

BACKGROUND

Many high speed measurement systems acquire many gigabytes per second (GB/s) of data and dump the acquired data to local memory for later processing, particularly when that processing is complex and highly reconfigurable. Dumping to local memory can be done, for example, to maintain throughput. In some cases (e.g., transient measurements or pulsed radio frequency (RF) measurements) only localized portions of the data are of interest and only the relevant portions need be processed to improve system throughput. In the case of quasi-periodic or triggered events, data is marked so that the events can later be identified. This is acceptable when the sampling rate is not extremely fast relative to the event rate. However, when the sampling rate is extremely fast, much time is spent looking for the marking events and large amounts of data may be transferred in intermediate stages that waste memory and time. In addition, in complex triggering situations the marking may not be available at the first transient event and important information is lost.

SUMMARY

A method for marking relevant data within an acquired set of data in accordance with an embodiment includes receiving a location of a first synchronization event within a synchronizing time pulse synchronized with the acquired set of data, searching the synchronizing time pulse within a predetermined window for the first synchronization event based on the location, identifying the first synchronization event based on the search, and obtaining data from the acquired set of data within an offset range determined based on the identified first synchronization event.

The location is used as a current location and the method iteratively includes, for a predetermined number of periods, applying an offset delta value to the current location to predict a location of a next synchronization event within the synchronizing time pulse, searching the synchronizing time pulse within a window based on a target period fraction for the next synchronization event based on the current location, and obtaining data from the acquired set of data within an offset range determined based on the identified next synchronization event. The offset delta value is based on an estimate of the period.

Upon failing to identify the next synchronization event, the window for searching can be iteratively widened, and the search repeated within the widened window until identifying the next synchronization event or reaching a predefined maximum width for the window. Once the next synchronization event is identified, the current location is updated for the next iteration based on the offset data value and a location of the identified next synchronization event within the synchronizing time pulse.

In an embodiment, the first synchronization event is received from a register, and a data start time and a data stop time from the register is also received from the register. In an embodiment, the offset delta is modified to be reduced by a number of samples based on a combination of the data start time and the data stop time and the offset range is modified to be reduced by a number of samples based on the data start time.

A system for marking relevant data within an acquired set of data in accordance with an embodiment includes an acquisition component configured to acquire a set of data and a synchronizing time pulse synchronized with the acquired set of data, a register configured to store the location of the first synchronization event, and a processing engine. The acquisition device can be, for example, a field-programmable gate array (FPGA) and is configured to identify a location of a first synchronization event within the synchronizing time pulse and the location is received in the register from the acquisition device. The processing engine is configured to perform the method described above.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the figure in which the part or element is first discussed.

Figure 1:
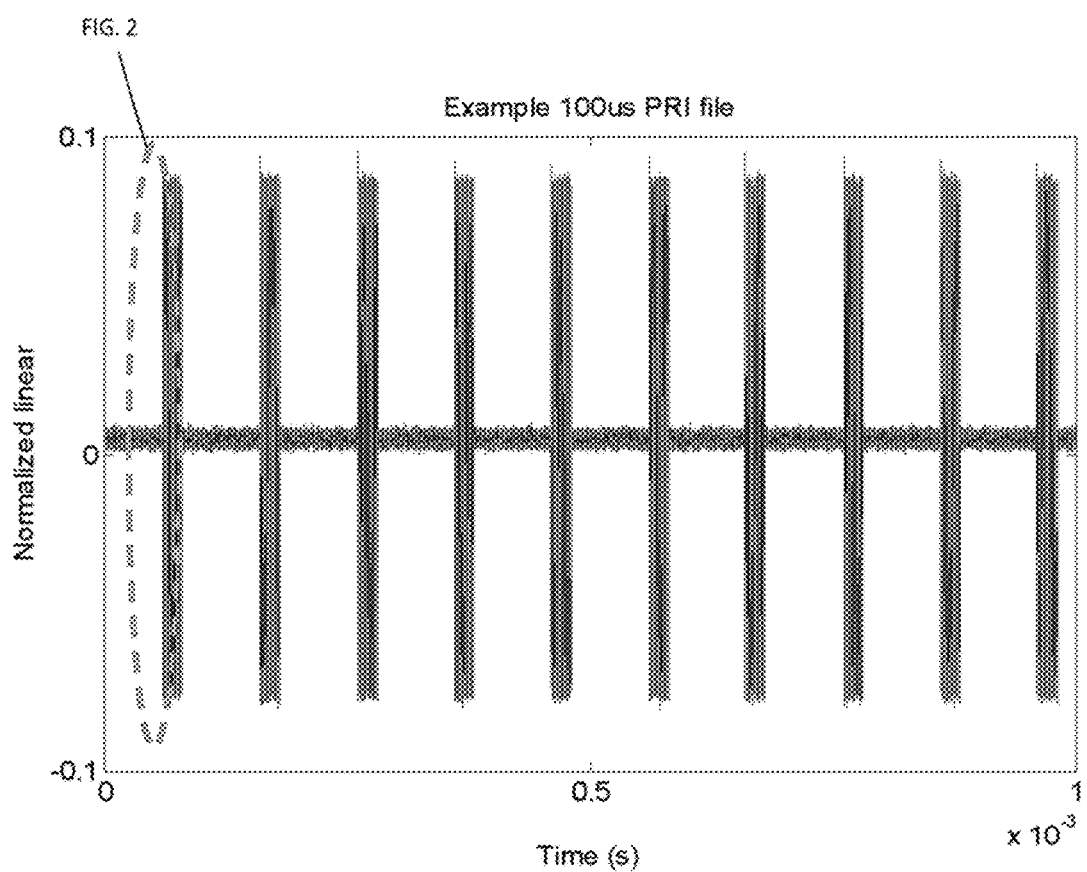
FIG. 1 illustrates an intermediate frequency (IF) signal from an example pulsed s-parameter measurement.
Figure 2:
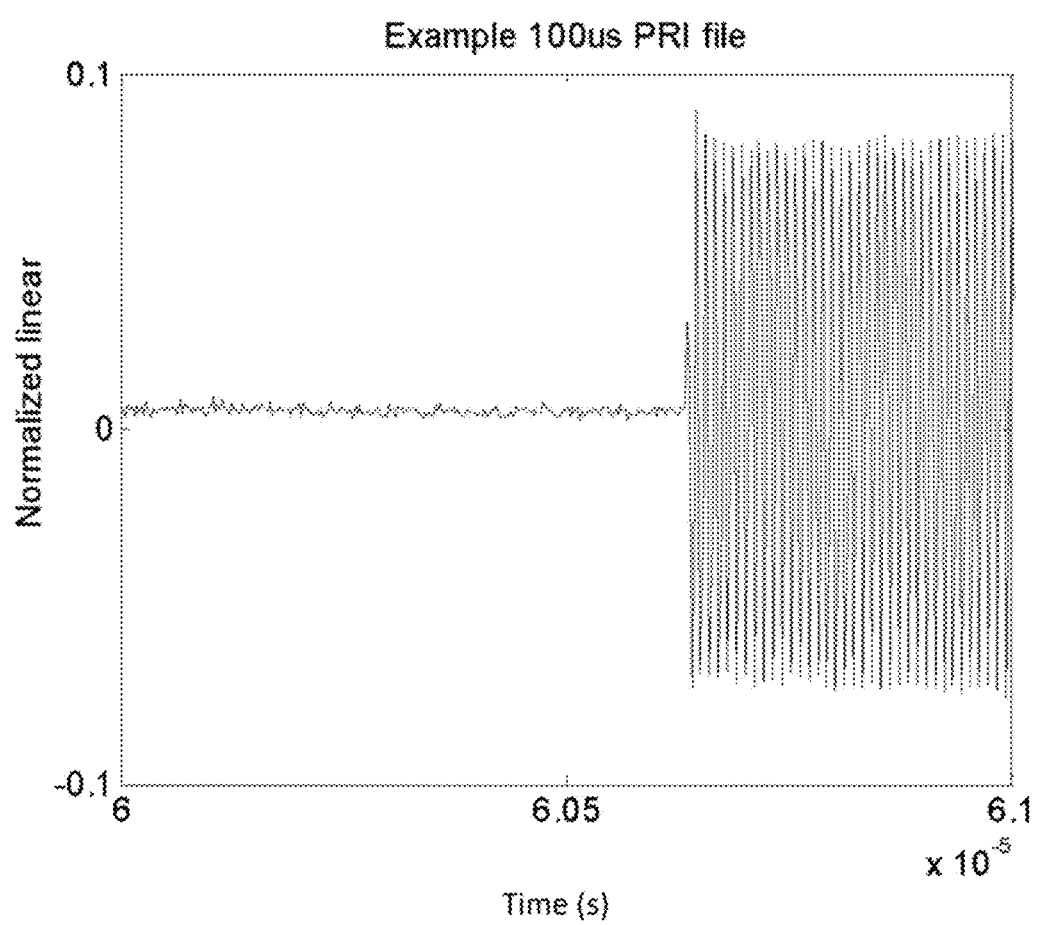
FIG. 2 is an expanded view of the circled portion of FIG. 1.

FIG. 1 shows an example of an intermediate (IF) signal from a pulsed S-parameter measurement (e.g., using pulse repetition interval (PRI) transmission and processing). FIG. 2 is an expanded view corresponding to the circled portion of FIG. 1. The periods, duty cycles, and frequencies involved can vary widely with different applications and pulses may not be entirely periodic (due to, for example, unsynchronized clocks or asynchronous triggering being part of the device being measured). The time scale can be anywhere from picoseconds to many seconds depending on the application.

Figures 3, 4:
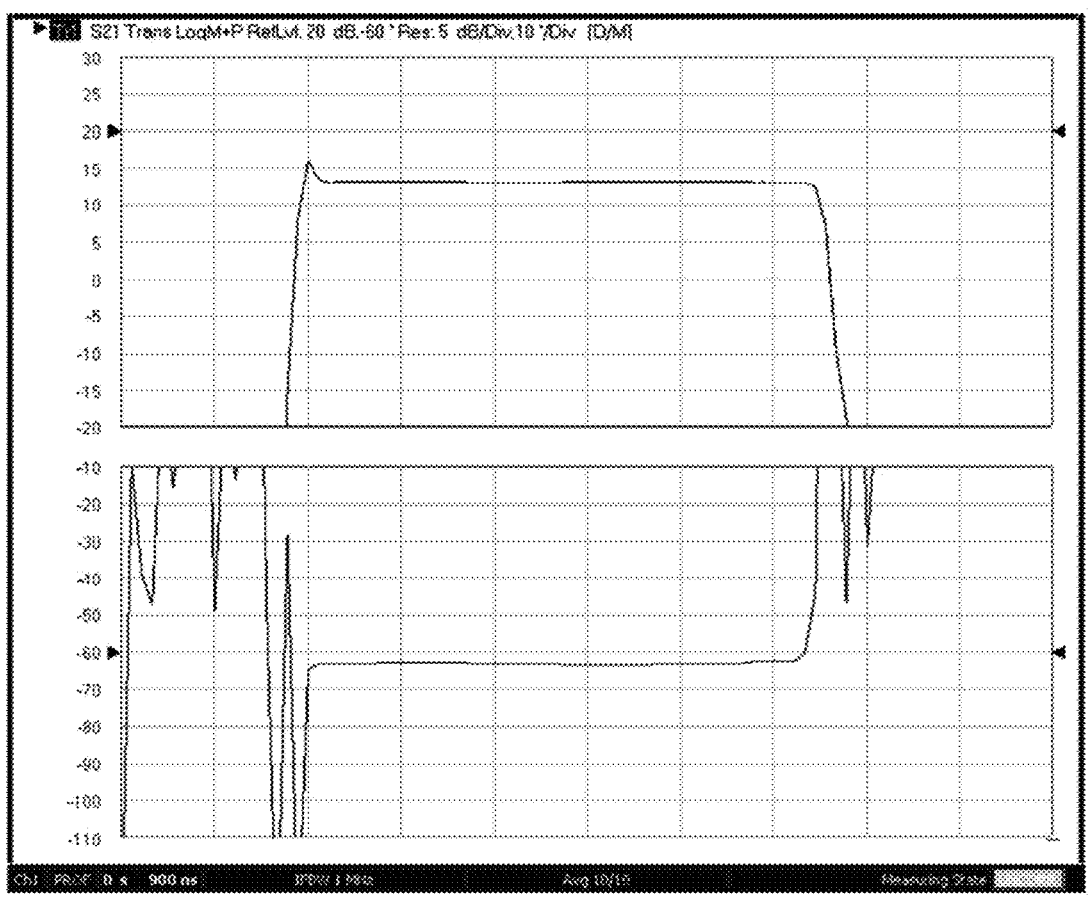
FIG. 3 illustrates an example of a processed pulse measurement.
FIG. 4 illustrates a data record including marked timing information.

In this type of semi-transient or transient measurement, it can be desirable to process small time intervals separately so that the evolution of some aspect of the signal over the time epoch being measured can be viewed. For example, short-time Fourier transforms (also referred to as limited discrete Fourier transforms) can be applied over small intervals of data to construct an envelope response. An example of a plot of the envelope response is shown in FIG. 3, which is an example of a processed pulse measurement. The magnitude and phase of an S-parameter can be plotted over time, covering one of the pulses similar to that shown in FIG. 1 or, more commonly, averaged over multiple pulses. Characteristics such as rise-time, overshoot, and droop of the envelope may be of interest.

While other types of processing are possible, typically the time scale of the collected data is referenced to another feature. For example, the time scale may be referenced to a synchronizing time pulse (illustrated in FIG. 4 as TO). In fast data acquisition systems, timing information can be marked in the data record schematically as shown in FIG. 4. As shown, the data string for unratioed parameter B2 is analyzed and some data (denoted by x's) of interest appears at some time after the synchronizing time pulse (denoted by a '1' in the TO record).

Complications can result when analyzing data records that are very long. For example, searching for every mark in the TO record can be time consuming and a specific delay may need to be processed after many pulses are identified. Further, if the data is being transferred continuously, there may be large spans of data that are of no interest. Pre-processing or transmitting this data can be needlessly time consuming and if many GBs of data are involved, this can be problematic. Still further, if a search process is not controlled carefully, the first (or first few) events can be missed in complex triggering situations (e.g., if device behavior on initial power-up or start-up needs to be studied, there may be triggering needed to start bias and stimulus very close in time to the initial measurement). Important transient information in these situations can then be lost. The first two of these complications can become more relevant as the fraction of data that is of interest declines (for example in a pulse measurement, when the duty cycle becomes small).

Systems and methods in accordance with embodiments can be applied to improve the marking and/or processing of regions of interest in long, continuously-acquired data records to keep track of transients of interest while maintaining throughput and reducing memory use by only analyzing regions of importance and not transferring uninteresting data. In embodiments, systems and methods can use register marking of a primary synchronization (synch) event and can use known pseudo-periodicity to project future likely locations of those synch events (at which location a localized search can be done). Further, in embodiments, systems and methods can use a gated transfer process to only move data further down a processing chain when proximal to a synch event or projected synch event.

Register Marking and Predictive Search

The core of data acquisition can identify when an initial trigger occurs. In an embodiment, a system can comprise a field-programmable gate array (FPGA) gating an analog-to-digital converter (ADC) for acquiring data, although in other embodiments, the system can comprise some other implementation or device for acquiring data. In an embodiment, the system can be set up to flag a first synch event after the initial trigger, thereby placing the location of this event in memory in a register for later processing stages to look at. Once all of the data (or a predetermined portion of all of the data) is acquired and processing of the data begins, the register can be used to analyze the first event. The processing stage can then begin a search at later periods for the next synch event based on an approximation of the period of events. In an embodiment, the search can be started, for example, at 0.01% of the period, a value which can be adjusted. If a synch event is not found in a given location, the search can be widened up to some predetermined limit before skipping to the next event. Once the synch event is found for a given period, the delay offset then tells the processing stage where to collect and analyze the data. Since searching through the whole synchronization record is not employed, time is saved. Since the first synch event is captured in the register, no transient information is missed.

Figure 5:
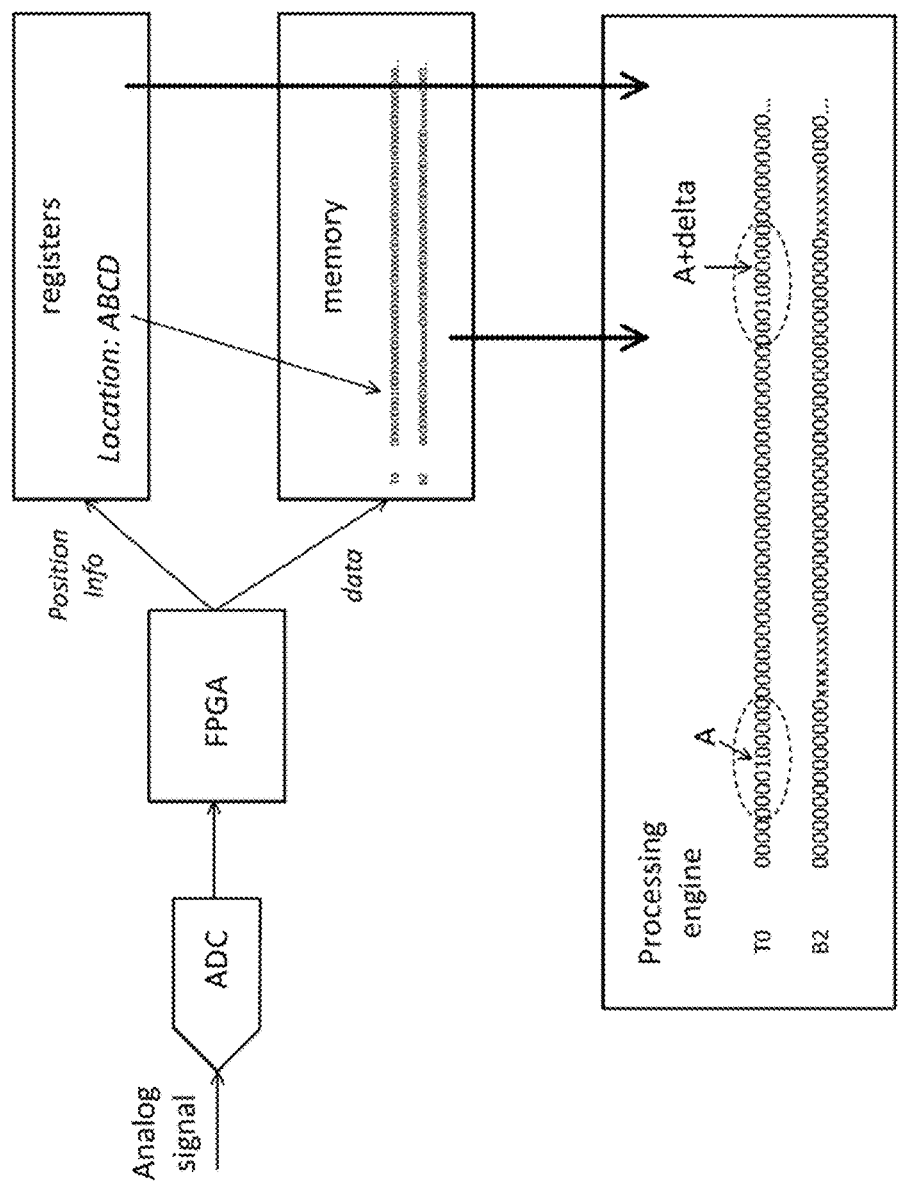
FIG. 5 illustrates a data flow of a method for data marking in accordance with an embodiment.
Figure 6:
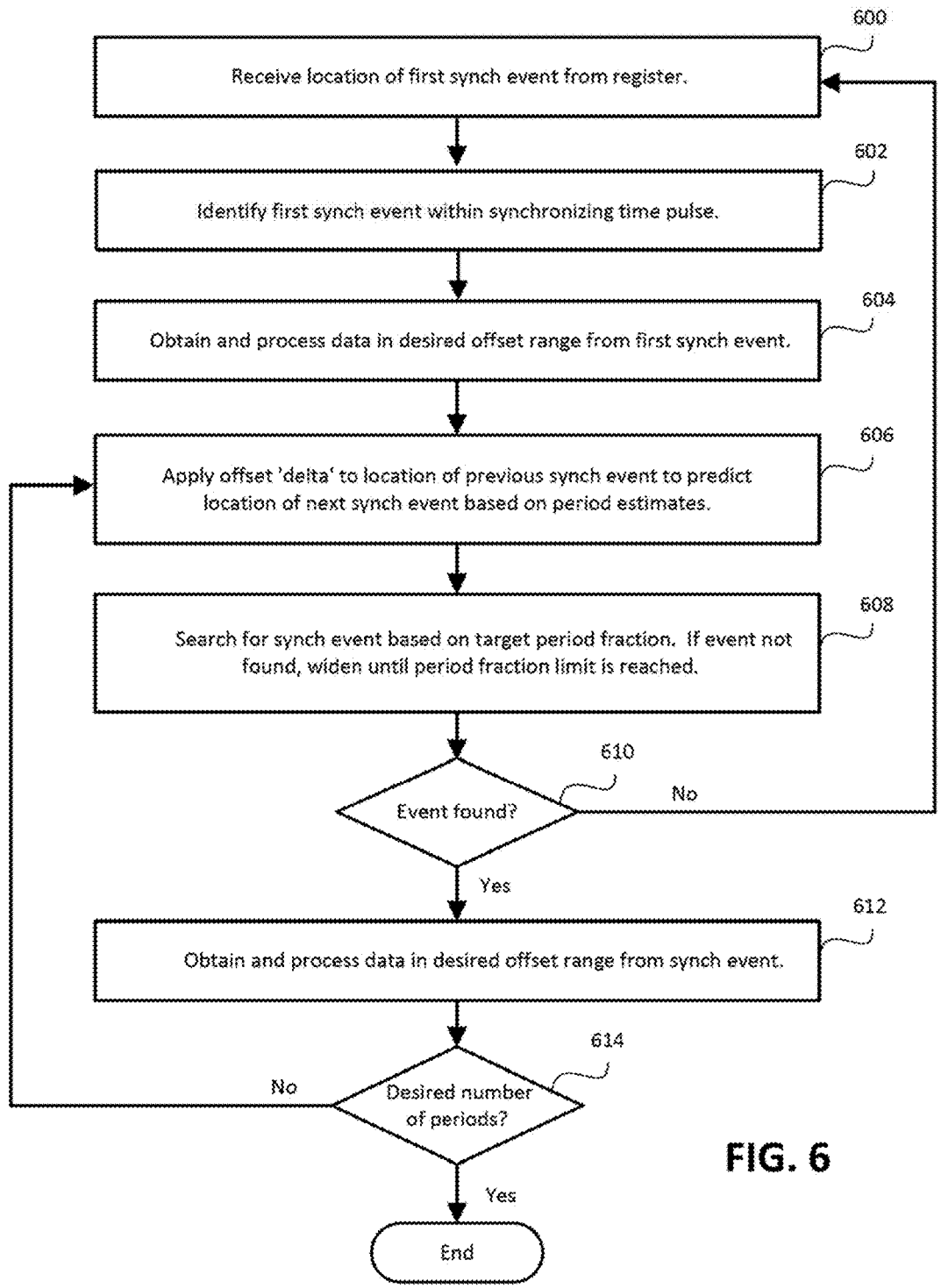
FIG. 6 is a flowchart of a portion of the method of FIG. 5.

A method for marking relevant data for processing in accordance with an embodiment is shown in the sequence of events of FIG. 5 and the flowchart of FIG. 6. As shown, an analog signal is received at an ADC where it is converted to a digital signal and passed to the FPGA (or other device) for data acquisition. The FPGA detects the first synch event after an initial trigger (identified by a "1" in the synchronizing time pulse, TO) and places the location (e.g., ABCD) of the event in the register.

Once all of the data (or a predetermined portion of all of the data) is acquired, the method comprises processing the data via a processing engine. The processing engine receives the location of the first synch event from the register (Step 600) and identifies the first synch event in the synchronizing time pulse string, TO (as shown, the first synch event is "A")(Step 602). The location received from the register may require additional searching to identify the first synch event within the synchronizing time pulse string. For example, a search can be performed within a certain range, such as the broken circle shown including the A event in FIG. 5. Using the location of the first synch event of the synchronizing time pulse string, the processing engine obtains and processes data from the acquired data string (as shown, from the data string of unratioed parameter B2) in a desired offset range from the first synch event (Step 604). The offset range should be selected to capture data of interest (e.g., xxxxxx in the data string).

Once the first set of data is obtained, an offset 'delta' is then applied to the location A of the first synch event to predict the location A+delta of the next synch event based on period estimates, for example (Step 606). The location predicted based on the offset 'delta' can be used as a rough estimate, with a search being performed for the next synch event within a range based on a target period fraction (Step 608). For example, the target period fraction is shown as the broken circle including the "A+delta" predicted event location in FIG. 5, wherein the next synch event is identified by a second "1" in the time synchronizing pulse, TO.

If the next synch event is not identified, the period fraction limit can be iteratively widened until either the next synch event is found or until a period fraction limit is reached. If the synch event is not found, processing can be restarted with new period estimates, for example. If the next synch event is found (Step 610), using the location of the synch event of the synchronizing time pulse string, the method further comprises obtaining and processing data from the acquired data string in a desired offset range from the next synch event (Step 612).

Once the second set of data is obtained, the method can iteratively repeat the steps of introducing the offset 'delta' to the location of the previous synch event to predict the location of the next synch event based on the period estimates, determining the location of the next synch event, and using the location of the synch event of the synchronizing time pulse string to obtain and process data from the acquired data string. The iterative repetition of steps can continue until data is obtained and processed for a desired number of periods (Step 614).

In other embodiments, the steps can be performed in different order. For example, in an embodiment the processing of the data obtained from the acquired data string can be performed after all of the data is obtained for the desired number of periods. Still further, in other embodiments the data string can be processed in parallel. For example, in an embodiment, once a threshold accuracy of predicting the location of subsequent events is achieved, the acquired data can be processed in parallel so that two or more threads search multiples of a refined "delta" difference to locate events in parallel.

Gated Transfer Process

Register marking and predictive search can reduce search time by roughly the ratio of the period to the sampling rate and avoids losing initial data. In embodiments, gated transfer can provide further improvement. For example, time is lost moving to a processing engine data that will not be used, as moving data can involve transferring data from one memory location to another with some index processing and other overhead. Systems and methods in accordance with embodiments can ignore sections of data during transfer and initial processing steps where a course estimate is available of the data of interest (e.g., a predicted pulse width).

Figure 7:
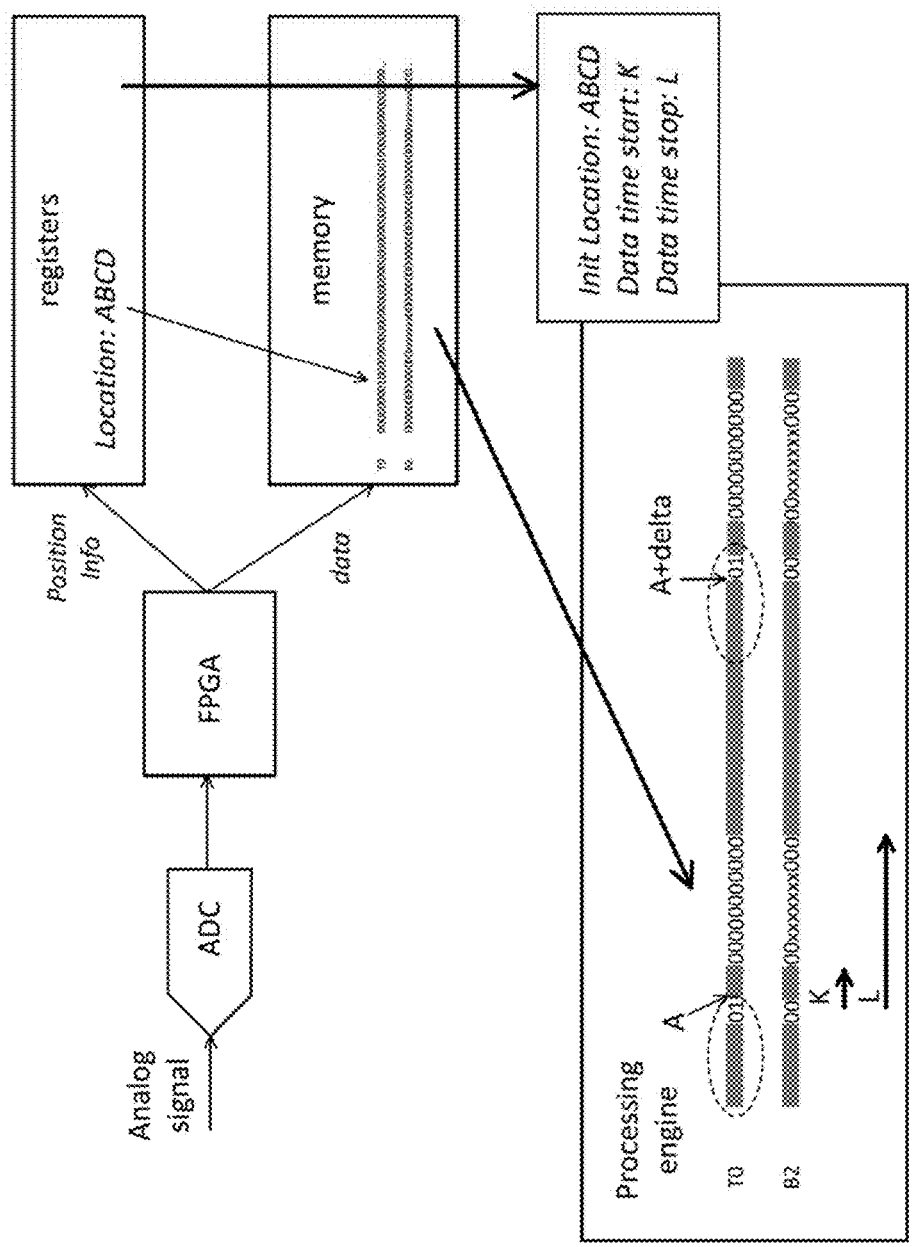
FIG. 7 illustrates a data flow of a method for data marking in accordance with a further embodiment.

FIG. 7 illustrates a method for marking relevant data for processing in accordance with an embodiment. Two additional register values (as shown labeled K and L) are passed to the processing engine to indicate where holes in the data are likely to be so that time indexing can be corrected. K indicates a data time start following a synch event and L indicates a data time stop following a synch event. As shown, the blocked out portions in the data string B2 are not transferred and are not pre-processed. Timing errors of one or more sampling periods are possible without the additional register values. The time savings with gated transfer varies roughly as 1/(duty cycle).

In addition to the steps described with respect to the method illustrated in FIGS. 5 and 6, a method in accordance with a further embodiment can account for data that are not transferred and are not pre-processed. The method therefore further comprises reducing the search delta for synch events past the first synch event by K+L samples, reducing the offset for obtaining data by K samples, and further constraining a maximum search range to be no more than the estimated period less K+L samples.

Figure 8:
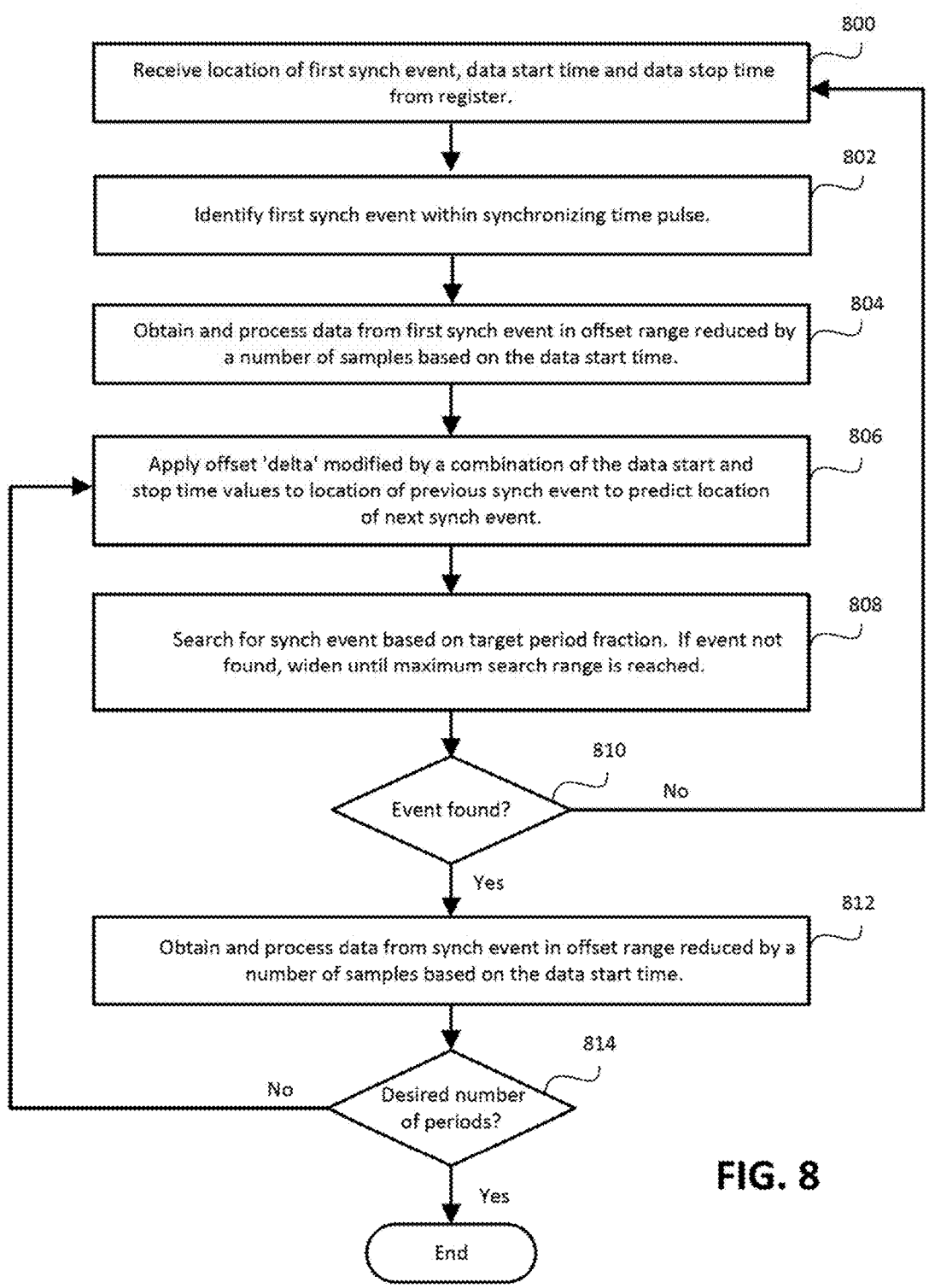
FIG. 8 is a flowchart of a portion of the method of FIG. 7.

A method for marking relevant data and gating transfer of data for processing in accordance with an embodiment is shown in the sequence of events of FIG. 7 and the flowchart of FIG. 8. As shown, an analog signal is received at an ADC where it is converted to a digital signal and passed to the FPGA (or other device) for data acquisition. The FPGA detects the first synch event after an initial trigger (identified by a "1" in the synchronizing time pulse, TO) and places the location (e.g., ABCD) of the event in the register.

Once all of the data (or a predetermined portion of all of the data) is acquired, the method comprises processing the data via a processing engine. The processing engine receives the location of the first synch event from the register and additionally receives the data start time and the data stop time values from the register (Step 800). The processing engine then identifies the first synch event in the synchronizing time pulse string, TO (as shown, the first synch event is "A")(Step 802). The location received from the register may require additional searching to identify the first synch event within the synchronizing time pulse string. For example, a search can be performed within a certain range, such as the broken circle shown including the A event in FIG. 7. Using the location of the first synch event of the synchronizing time pulse string, the processing engine obtains and processes data from the acquired data string (as shown, from the data string of unratioed parameter B2) based on the first synch event in a desired offset range reduced by the data time start value (Step 804).

Once the first set of data is obtained, a modified offset 'delta' is then applied to the location A of the first synch event to predict the location A+delta of the next synch event (Step 806). The offset 'delta' is modified by reducing a default delta (based on the period estimate, for example as used in the method of FIG. 6) by a number of samples corresponding to a combination of the data start time and the data stop time values obtained from the register. The location predicted based on the modified offset 'delta' can be used as a rough estimate, with a search being performed for the next synch event within a range based on a target period fraction (Step 808). For example, the target period fraction is shown as the broken circle including the "A+delta" predicted event location in FIG. 7, wherein the next synch event is identified by a second "1" in the time synchronizing pulse, TO.

If the next synch event is not identified, the period fraction limit can be iteratively widened until either the next synch event is found or until a period fraction limit is reached. The period fraction limit (i.e., the maximum search range) can be further constrained to be no more than the estimated period less the combination of the data start time and data stop time values. If the next synch event is not found, processing can be restarted with new period estimates, for example. If the next synch event is found (Step 810), the method further comprises obtaining and processing data from the acquired data string from the next synch event in a desired offset range reduced by the data time start value (Step 812).

Once the second set of data is obtained, the method can iteratively repeat the steps of introducing the modified offset 'delta' to the location of the previous synch event to predict the location of the next synch event based on the period estimates, determining the location of the next synch event, and using the location of the synch event of the synchronizing time pulse string to obtain and process data from the acquired data string. The iterative repetition of steps can continue until data is obtained and processed for a desired number of periods (Step 814).

The present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A method for obtaining data of interest for a device under test (DUT) acquired by a measuring instrument transmitting pulsed radio frequency (RF) test signals to the DUT, the method comprising:
   receiving an analog signal from the device under test and using an analog to digital converter (ADC) to generate a set of measurement data from the analog signal;
   receiving, from a register, a location estimated to correspond with a first synchronization event within a synchronizing time pulse separate from and synchronized with the acquired set of measurement data,
   wherein a synchronization event is associated with timing of a pulsed RF test signal,
   wherein the location is inserted into the register in response to an initial trigger;
   searching the synchronizing time pulse within a predetermined window for the first synchronization event based on the location;
   identifying the first synchronization event based on the search;
   obtaining particular measurement data from the acquired set of measurement data within an offset range determined based on the identified first synchronization event;
   wherein a location of the identified first synchronization event within the synchronizing time pulse is designated as a current location; and
   iteratively performing the following for a predetermined number of periods, wherein a period is an estimate of a length of time from an initiation of a pulsed RF test signal to an initiation of a next pulsed RF test signal:
      applying an offset delta value to the current location to predict a location of a next synchronization event within the synchronizing time pulse;
      wherein the offset delta value is based on the period;
      searching the synchronizing time pulse within a window based on a target period fraction for the next synchronization event based on the current location;
      iteratively widening the window, upon failing to identify the next synchronization event, and repeating the search within the widened window until identifying the next synchronization event or reaching a predefined maximum width for the window;
      obtaining particular measurement data from the acquired set of measurement data within the offset range determined based on the identified next synchronization event; and
      updating the current location based on a location of the identified next synchronization event within the synchronizing time pulse.

2. The method of claim 1, further comprising processing the obtained particular measurement data.

3. The method of claim 2, further comprising transferring the obtained particular measurement data from one memory location to another prior to processing the obtained particular measurement data.

4. The method of claim 1, further comprising receiving a data start time and a data stop time from the register;
   wherein the offset delta is modified to be reduced by a number of samples based on a combination of the data start time and the data stop time;
   wherein the offset range is modified to be reduced by a number of samples based on the data start time.

5. A system for obtaining data of interest for a device under test (DUT) acquired by a measuring instrument transmitting pulsed radio frequency (RF) test signals to the DUT, the system comprising:
   an analog to digital converter (ADC) which receives an analog signal from the device under test and generates a set of measurement data;
   an acquisition component configured to acquire the set of measurement data from the ADC and a synchronizing time pulse separate from and synchronized with the acquired set of data,
   wherein the synchronizing time pulse includes synchronization events associated with timing of the pulsed RF test signals;
   wherein the acquisition component is further configured to identify a location estimated to correspond with a first synchronization event within the synchronizing time pulse in response to an initial trigger;
   a register configured to store the location, the location being received from the acquisition device, wherein the location is inserted into the register in response to the initial trigger; and
   a processing engine configured to perform the steps of
      receiving the location estimated to correspond with the first synchronization event from the register;
      searching the synchronizing time pulse within a predetermined window for the first synchronization event based on the location;
      identifying the first synchronization event based on the search;
      obtaining particular measurement data from the acquired set of measurement data within an offset range determined based on the identified first synchronization event;
      wherein a location of the identified first synchronization event within the synchronizing time pulse is designated as a current location;
      iteratively performing the following for a predetermined number of periods, wherein a period is an estimate of a length of time from an initiation of a pulsed RF test signal to an initiation of a next pulsed RF test signal:
         applying an offset delta value to the current location to predict a location of a next synchronization event within the synchronizing time pulse;
         wherein the offset delta value is based on the period;
         searching the synchronizing time pulse within a window based on a target period fraction for the next synchronization event based on the current location;
         iteratively widening the window, upon failing to identify the next synchronization event, and repeating the search within the widened window until identifying the next synchronization event or reaching a predefined maximum width for the window;
         obtaining particular measurement data from the acquired set of measurement data within the offset range determined based on the identified next synchronization event; and
         updating the current location based on a location of the identified next synchronization event within the synchronizing time pulse.

6. The system of claim 5, wherein the acquisition component is a field-programmable gate array (FPGA).

7. The system of claim 5, wherein the processing engine is configured to perform the further step of processing the obtained particular measurement data.

8. The system of claim 7, wherein the processing engine is configured to perform the further step of transferring the obtained particular measurement data from one memory location to another prior to processing the obtained particular measurement data.

9. The system of claim 5, wherein the register configured to store a data start time and a data stop time; and
   wherein the process engine is configured to
      reduce the offset delta by a number of samples based on a combination of the data start time and the data stop time, and
      reduce the offset range by a number of samples based on the data start time.

10. A non-transitory machine readable storage medium having instructions thereon that when executed cause a system to:
   receive an analog signal from the device under test and using an analog to digital converter (ADC) to generate a set of measurement data from the analog signal;
   receive, from a register, a location estimated to correspond with a first synchronization event within a synchronizing time pulse separate from and synchronized with the set of measurement data for a device under test (DUT) acquired by a measuring instrument transmitting pulsed radio frequency (RF) test signals to the DUT,
   wherein a synchronization event is associated with timing of a pulsed RF test signal,
   wherein the location is inserted into the register after an initial trigger;
   search the synchronizing time pulse within a predetermined window for the first synchronization event based on the location;
   identify the first synchronization event based on the search;
   obtain particular measurement data from the acquired set of measurement data within an offset range determined based on the identified first synchronization event;
   wherein a location of the identified first synchronization event within the synchronizing time pulse is designated as a current location; and
   iteratively perform the following for a predetermined number of periods, wherein a period is an estimate of a length of time from an initiation of a pulsed RF test signal to an initiation of a next pulsed RF test signal:
      apply an offset delta value to the current location to predict a location of a next synchronization event within the synchronizing time pulse;
      wherein the offset delta value is based on the period;
      search the synchronizing time pulse within a window based on a target period fraction for the next synchronization event based on the current location;
      iteratively widen the window, upon failing to identify the next synchronization event, and repeating the search within the widened window until identifying the next synchronization event or reaching a predefined maximum width for the window;
      obtain particular measurement data from the acquired set of measurement data within an offset range determined based on the identified next synchronization event; and
      update the current location based on a location of the identified next synchronization event within the synchronizing time pulse.

11. The non-transitory machine readable storage medium of claim 10, further comprising instructions thereon that when executed cause a system to:
   process the obtained particular measurement data.

12. The non-transitory machine readable storage medium of claim 11, further comprising instructions thereon that when executed cause a system to:
   transfer the obtained particular measurement data from one memory location to another prior to processing the obtained particular measurement data.

13. The non-transitory machine readable storage medium of claim 10, further comprising instructions thereon that when executed cause a system to:
   receive a data start time and a data stop time from the register;
   wherein the offset delta is modified to be reduced by a number of samples based on a combination of the data start time and the data stop time;
   wherein the offset range is modified to be reduced by a number of samples based on the data start time.

* * * * *